United States Patent [19]

Xu et al.

[11] Patent Number: 4,899,201
[45] Date of Patent: Feb. 6, 1990

[54] ELECTRONIC AND OPTOELECTRIC DEVICES UTILIZING LIGHT HOLE PROPERTIES

[75] Inventors: Jingming Xu, Toronto, Canada; Michael Shur, Golden Valley, Minn.; Mark Sweeny, Ossining, N.Y.

[73] Assignee: Regents of the University of Minnesota, St. Paul, Minn.

[21] Appl. No.: 363,367

[22] Filed: May 31, 1989

Related U.S. Application Data

[63] Continuation of Ser. No. 85,908, Aug. 14, 1987, abandoned.

[51] Int. Cl.$^4$ ............................................. H01L 29/80
[52] U.S. Cl. ........................................ 357/22; 357/16; 357/15; 357/4; 357/42
[58] Field of Search .................. 357/16, 4, 42, 22 I, 357/22 J, 22 K, 22 A, 22 G, 22 GR, 23.5, 22 S, 22 MD

[56] References Cited

U.S. PATENT DOCUMENTS

| | | | |
|---|---|---|---|
| 3,252,003 | 5/1966 | Schmidt | 357/15 X |
| 3,703,408 | 11/1972 | Belasco et al. | 357/15 X |
| 4,104,672 | 8/1978 | DiLorenzo et al. | 357/22 K |
| 4,163,237 | 7/1979 | Dingle et al. | 357/22 A X |
| 4,194,935 | 3/1980 | Dingle et al. | 357/22 A X |
| 4,463,366 | 7/1984 | Ishii et al. | 357/22 I |
| 4,583,107 | 4/1986 | Clarke | 357/20 X |
| 4,665,412 | 5/1987 | Ohkawa et al. | 357/6 |
| 4,688,068 | 8/1987 | Chaffin et al. | 357/30 |
| 4,751,194 | 6/1988 | Cibert et al. | 437/24 |
| 4,751,378 | 6/1988 | Hinton et al. | 250/211 J |

FOREIGN PATENT DOCUMENTS

| | | | |
|---|---|---|---|
| 44-17943 | 8/1969 | Japan | 357/17 M |
| 61-18180 | 1/1986 | Japan | 357/22 I |
| 2189345 | 10/1987 | United Kingdom | 357/22 MD |

OTHER PUBLICATIONS

Sakaki, H., "Scattering Suppression and High-Mobility Effect of Size-Quantized Electrons in Ultrafine Semiconductor Wire Structures", Japanese Journal of Applied Physics, vol. 19, No. 12, Dec. 1980, pp. L735-L738.

Arakawa, Y. and Yariv, A., "Quantum Well Lasers-Gain, Spectra, Dynamics", IEEE Journal of Quantum Electronics, vol. QE-22, No. 9, Sep. 1986, pp. 1887-1897.

Arakawa, Y. and Sakaki, H., "Multidimensional Quantum Well Laser and Temperature Dependence of Its Threshold Current", Appl. Phys. Lett., 40(11), Jun. 1, 1982, pp. 939-941.

Asada, M. et al., "Theoretical Gain of Quantum-Well Wire Lasers", Japanese Journal of Applied Physics, vol. 24, No. 2, Feb. 1985, pp. L95-L97.

Kroemer, H. and Okamoto, H., "Some Design Considerations for Multi-Quantum-Well Lasers", Japanese Journal of Applied Physics, vol. 23, No. 8, Aug. 1984, pp. 970-974.

Petroff, P. M. et al., "Toward Quantum Well Wires: Fabrication and Optical Properties", Appl. Phys. Lett., Oct. 1, 1982, pp. 636-638.

Cirillo, N. C. et al., article entitled "Complementary Heterostructure Insulated Gate Field Effect Transistors (HIGFETs)", Honeywell Inc. Physical Sciences Center; University of Minnesota, Department of Electrical Engineering (date unknown).

Tavger, B. A., "Dependence of the Nature of the Electron Energy Bands in a Semiconducting Film on its Thickness", Soviet Physics JEPT, vol. 21, No. 1, Jul. 1965, p. 125.

(List continued on next page.)

Primary Examiner—William Mintel
Attorney, Agent, or Firm—Kinney & Lange

[57] ABSTRACT

Improved p-channel FETs and optoelectronic devices make use of reduced hole effective mass achieved with quantum confinement. The devices include multiple one-dimensional p-channel FETs which have electrically induced and controllable one dimensional p-type semiconductor wires; square well two-dimensional p-channel FETs; and laser diodes and light emitting diodes which use one dimensional p-type semiconductor wires.

7 Claims, 8 Drawing Sheets

OTHER PUBLICATIONS

Nedorezov, S. S., "Space Quantization in Semiconductor Films", *Soviet Physics—Solid State*, vol. 12, No. 8, Feb. 1971, pp. 1814–1819.

Fowler, A. B. et al., "Conductance in Restricted-Dimensionality Accumulation Layers", *Physical Review Letters*, vol. 48, No. 3, Jan. 18, 1982, pp. 196–199.

Solomon, Paul M.; Morkoc, H., "Modulation-Doped GaAs/AiGaAs Heterojunction Field-Effect Transistors (MODFET's), Ultrahigh-Speed Device for Supercomputers", *Transactions on Electron Devices*, vol. ED-31, No. 8, Aug. 1984, pp. 1015–1027.

Chang, Yai-Chung; Schulman, J. N., "Band Mixing Effect in Semiconductor Superlattices", *Superlattices and Microstructures*, vol. 1, No. 4, 1985, pp. 357–361.

Osbourn, G. C., "Electron and Hole Effective Masses for Two-Dimensional Transport in Strained-Layer Superlattices", *Superlattices and Microstructures*, vol. 1, No. 3, 1985, pp. 223–226.

Altarelli, M.; Ekenberg, U., "Calculations of Hole Subbands in Semiconductor Quantum Wells and Superlattices", *Physical Review B*, vol. 32, No. 8, Oct. 15, 1985, pp. 5138–5143.

Lee, J.; Vassell, M. O., "Hole Subbands in Semiconductor Thin Layers", *Physical Review B*, vol. 34, No. 10, Nov. 15, 1986, pp. 7383–7384.

Yuh et al., "One Dimensional Transport in Quantum Well Wire-High Electron Mobility", *Appl. Phys. Lett.*, 49(25) 22 Dec. '86, 1738–1740.

ELECTRONIC AND OPTOELECTRIC DEVICES UTILIZING LIGHT HOLE PROPERTIES

This a continuation of application Ser. No. 07/085,908, filed Aug. 14, 1987 (now abandoned).

BACKGROUND OF THE INVENTION

1. Field of the Invention.

The present invention relates to semiconductor devices, and in particular to devices having hole mobility enhancement and/or density of state reduction through the use of one-dimensional or two-dimensional p-type quantum wells.

2. Description of the Prior Art.

In semiconductors, there are both light and heavy holes in the valence bands. They are usually degenerate in energy at the gamma point of the k-space in most bulk materials. The density of states of heavy holes is larger than that of light holes, while the mobility of heavy holes is lower than that of light holes. The low mobility of heavy holes leads to the low speed of conventional p-channel devices in which the conduction is primarily carried out by heavy holes. Consequently, the speed of conventional complementary structures comprising a pair of n-channel and p-channel devices is also limited. This has been a major difficulty for complementary circuits since their invention. In addition, the larger density of state associated with large hole effective mass has been partially responsible to the problem of large threshold current in modern optoelectronic devices.

Along with the rapid advance of high speed compound semiconductor devices, fast p-channel devices have become increasingly important. To compete with the Si CMOS technology, a great deal of effort has been devoted to the development of III-V compound complementary devices in the last decade. One of the major problems with the III-V compound complementary devices is that while very high speed n-channel devices have been developed, the p-channel devices to date are relatively slow mainly because of the heavy hole effective mass. This means that the speed of a III-V complementary device is limited to the speed of its p-channel device which is approximately ten times slower than the corresponding n-channel device. Recently, some progress toward III-V complementary structures has been made and complementary undoped heteroinsulator FETs utilizing two-dimensional (2-D) electron and hole gases has been successfully demonstrated. However, the mobility and velocity of 2-D hole gas in such devices are still much smaller than that of 2-D electron gas.

The tetrahedral symmetry in a zinc-blende semiconductor may be broken by strain resulting in splitting in hole subbands at the gamma point and a mass in the lowest hole subband lighter than the heavy hole mass. In principle, the performance of p-type devices may, therefore, be greatly enhanced through utilizing such light hole states. Recently, this important observation has stimulated a great deal of interest in possible device applications.

SUMMARY OF THE INVENTION

We have found that the band structure of holes in a one-dimensional (1-D) system is considerably different from the three-dimensional (3-D) bulk case. The band structure in a 1-D case contains many overlapping subbands, with subband splitting inversely proportional to the square of the radius of the 1-D semiconductor wire. In a fairly large energy range the dependence of the energy on the wave vector for the lowest subbands is nearly linear. The effective mass of holes is smaller than the heavy hole effective mass.

We have also studied the effect of sharpness of quantum wells on the hole effective mass in 2-D structures. We have found that in 2-D systems, the hole effective mass is lighter in sharp quantum wells, such as square wells, than in soft quantum wells such as triangular or parabolic wells.

Based upon these discoveries, we have invented a family of new p-channel, complementary, and optoelectronic semiconductor devices where hole mobility enhancement or density of state reduction is achieved by the tetrahedral symmetry breaking resulting from confining holes to very narrow 2-D or 1-D channels. The p-channel and complementary electronic devices have the advantage of high speed compared to devices using conventional p-channel structures. Optoelectronic devices having 1-D p+ wires have the advantage of being easy to invert the carrier population because of the lower effective mass and smaller and peaked density of states (i.e. of lower threshold current for stimulated emission).

DETAILED DESCRIPTION OF THE PREFERRED EMBODIMENTS

1. Multiple 1-D p-Channel Devices with Strip Gates

We have discovered a substantially improved operation of p-channel and complementary devices by taking advantage of the higher mobility of light holes. By using quantum confinement in a p-type region, the hole effective mass can be decreased within that region. This not only increases hole mobilitiy, but also reduces scattering.

In a 1-D quantum confinement system (i.e. a system in which there is quantum confinement in all but one dimension) the hole effective mass in most subbands is much lighter than the heavy hole mass. This behavior, together with the suppressed scattering in a 1-D system, offers capability of much higher speed in 1-D p-channel FETs than in traditional 2-D p-channel FETs. FIGS. 1A, 1B through 8 show devices which make use of multiple 1-D p-channel devices, where conduction is through p-type "semiconductor wires" which can be modulated by the application of a gate voltage to the gate of the p-channel device.

Figure 1A:
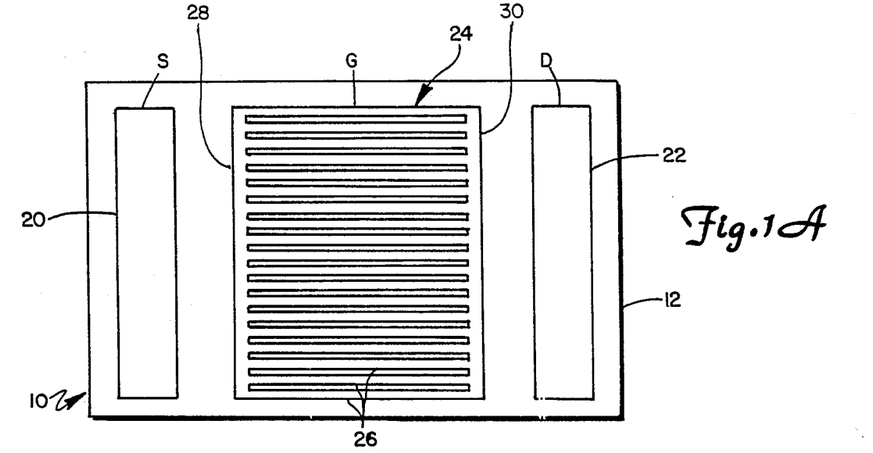
FIGS. 1A and 1B are top and cross-sectional views of a MESFET type multiple 1-D p-channel device with a strip gate.
Figure 1B:
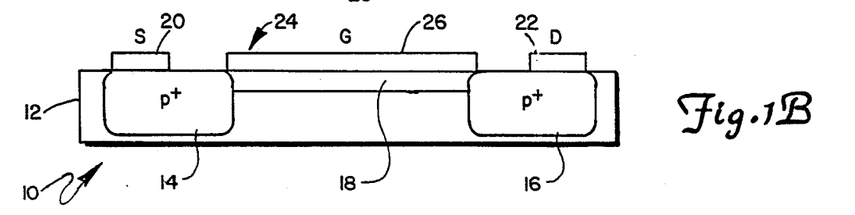

FIGS. 1A and 1B show a MESFET type multiple 1-D p-channel device 10 which is a homostructure. In other words, all of the body of MESFET type device 10 is formed of the same material which can be selected from a wide variety of different semiconductor materials including GaAs, InGaAs, InP, and Si.

MESFET 10 includes a semi-insulating substrate 12 with a p+ source region 14, a p+ drain region 16, and a highly doped p+ layer 18 which extends between source region 14 and drain region 16. Source contact 20 provides electrical connection to source region 14, and drain contact 22 provides electrical connection to drain region 16.

Overlying p+ layer 18 is strip gate 24, which is formed by a plurality of spaced parallel longitudinal strips 26 which are connected together at the source and drain ends by transfer strips 28 and 30, respectively. Strips 26 extend longitudinally in the source-to-drain direction. The width of strips 26 is preferably on the order of about 100 to 500 Angstroms, which is about the same dimension as the depth of p+ layer 18. The spacing between strips 26 is also preferably on the order of 100 to 500 Angstroms.

By applying a bias to gate 24, quasi 1-D conducting channels of p-type conductivity are formed. For example, by applying a positive gate voltage, the regions immediately below strips 26 will have holes depleted, so that 1-D semiconductor wires of p+ conductivity are formed under the gate between strips 26. If a large enough positive gate voltage is applied, the depletion regions under strips 26 will grow and encroach on the p+ wires underneath the gaps until the 1-D p+ wires are pinched off.

MESFET 10 can also operate in an enhancement mode by applying negative gate voltage to gate 24. A negative gate voltage attracts holes to the regions immediately below strips 26. In the enhancement mode, therefore, the 1-D p+ semiconductor wires are located immediately below strips 26. The larger the negative gate bias voltage, the larger the cross-section of the 1-D p+ semiconductor wires under each strip 26.

In the embodiment shown in FIGS. 1A and 1B, MESFET 10 uses a highly doped shallow p+ layer 18 together with a strip gate 24 to provide a quantum confinement region in which the quasi 1-D conducting channels extend from source 14 to drain 16. The use of multiple strips 26 in gate 24 provides an extra degree of design freedom because different levels of current carrying capability can be provided simply by changing the number of strips 26 of strip gate 24. The more gate strips 26, the more 1-D p+ semiconductor conductor wires which are formed by biasing, and thus the more current carrying capability.

Because a quasi 1-D semiconductor wire of p+ conductivity is formed in either the depletion mode or the enhancement mode, MESFET 10 offers a lighter hole effective mass. The holes are confined, in effect, to movement of a single dimension (i.e. in the source-to-drain direction). MESFET 10, therefore, offers higher speed due both to the use of light holes resulting from quantum confinement and reduced scattering.

Figure 2A:
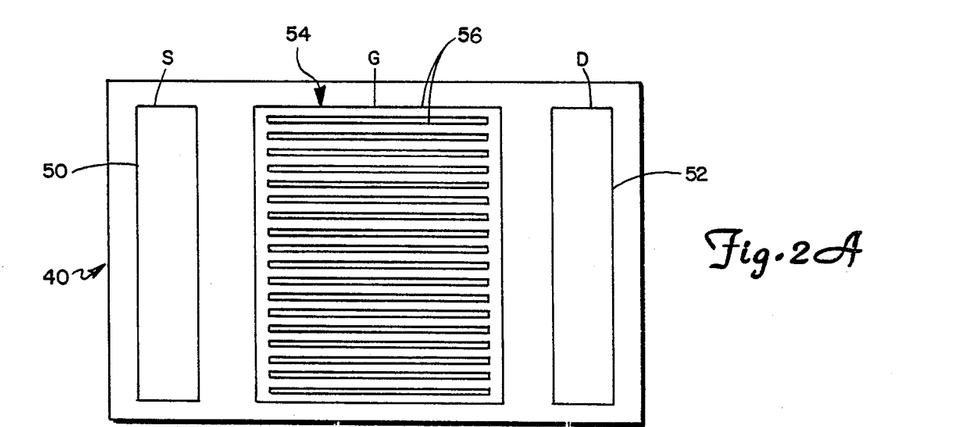
FIGS. 2A and 2B are top and cross-sectional views of a heterostructure type multiple 1-D p-channel device with a strip gate.
Figure 2B:
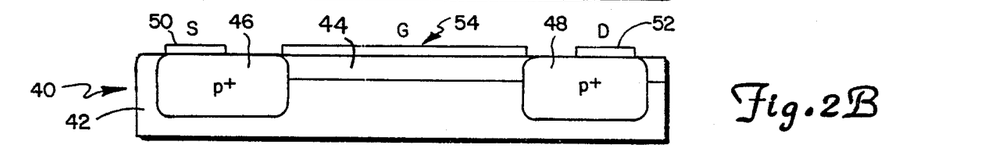

FIG. 2 shows a heterostructure FET 40 formed by narrow band gap substrate 42 and thin wide band gap layer 44, which form heterojunction 46 at their interface. Substrate 42 is an undoped or lightly doped narrow band gap material such as GaAs, InGaAs, InP, GeSi, etc., while layer 44 is either modulation doped or undoped material with a wider band gap than substrate 42. Examples of wider band gap material include AlGaAs, InAlAs, and Si, and will depend upon the particular material used for substrate 42.

FET 40 includes p+ source region 46, p+ drain region 48, source contact 50, drain contact 52, and strip gate 54. By applying a bias to strip gate 54, it is possible to turn on and off 1-D hole gas wires which are formed in narrow band gap material 42 at and below heterojunction 46. By applying a positive gate voltage, holes are repelled from under the strips, so that the 1-D hole gas wires are formed under the gaps between strips 56 of strip gate 54. Conversely, a negative gate voltage attracts holes so that the 1-D hole gas wires are located under strips 56.

The wide gap/narrow gap material combination preferably have valance band discontinuities which are large enough to confine holes in the vertical direction (i.e. perpendicular to heterojunction 46). Confinement in the transferse direction is provided by the strip gate induced inversion wells and barriers formed by the gate bias applied to strip gate 54.

Figure 3A:
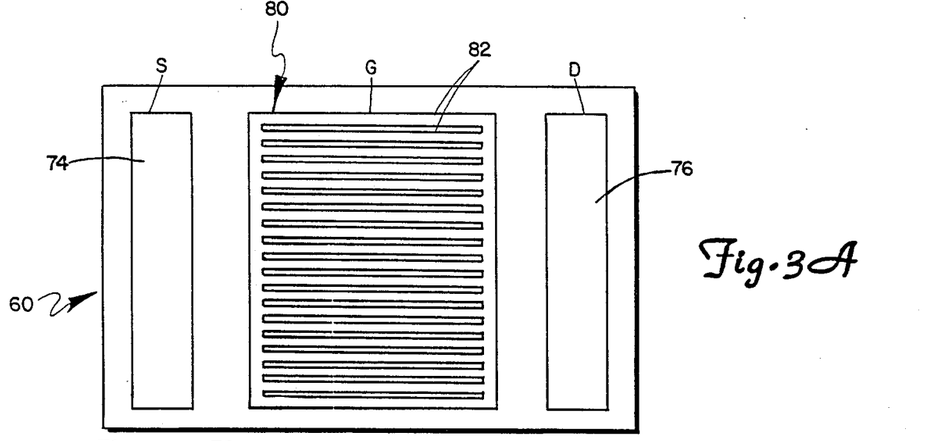
FIGS. 3A and 3B are top and cross-sectional views of a single square well heterostructure type multiple 1-D p-channel device with a strip gate.
Figure 3B:
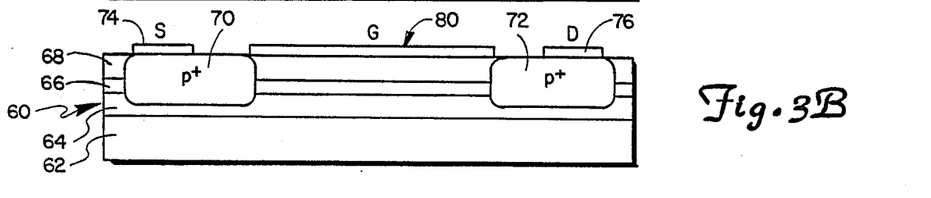

FIGS. 3A and 3B show FET 60, which is a heterostructure FET with a single square quantum well and a strip gate configuration. As shown in FIG. 3B, semi-insulating substrate 62 is covered by a wide band gap layer 64, which in turn is covered by a narrow band gap layer 66, followed by another wide band gap layer 68. The result is a single square quantum well formed by narrow band gap layer 66 which is sandwiched between wider band gap layers 64 and 68. The thickness of narrow band gap layer 66 will differ depending upon the particular narrow band gap material selected, but should be of a proper dimension so that quantum confinement in the vertical direction is present. In GaAs, for example, the preferred thickness is between about 2 Angstroms and about 600 Angstroms.

FET 60 includes p+ source 70, p+ drain 72, source contact 74, drain contact 76, and strip gate 80. By applying a bias voltage to gate 80, 1-D p-type semiconductor wires are formed and their current-carrying characteristics can be modified by varying the gate voltage. Quantum confinement in the vertical direction occurs within the quantum well (i.e. within narrow band gap layer 66) due to the difference in band gaps between layer 66 and the adjacent layers 64 and 68. Confinement in the transverse direction is provided as a result of the gate voltage applied to strip gate 80. A gate voltage which is positive tends to create depletion below strips 82, so that the 1-D p+ semi-conductor wires are located below the gaps between strips 82. Conversely, negative bias voltage results in accumulation of holes under strips 82, so that the p+ semiconductor 1-D wires extend in layer 66 below strips 82.

A square well provides stronger confinement than does a triangular or other (soft) quantum well. This stronger confinement leads to lighter hole mass, and therefore FET 60 with its square well configuration offers higher speed operation.

Figure 4A:
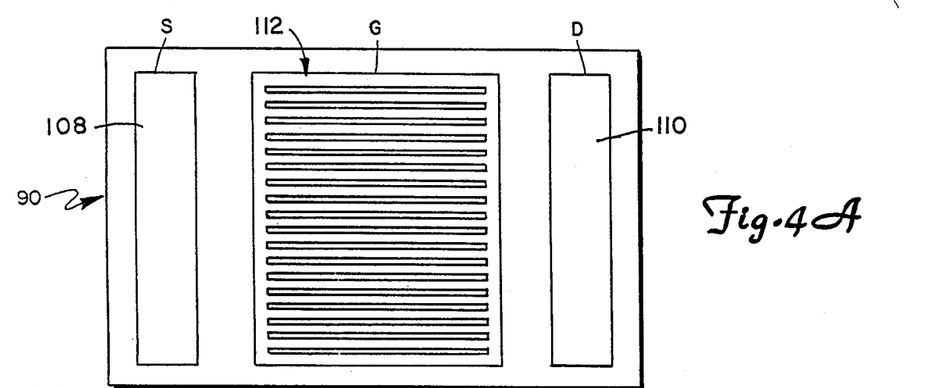
FIGS. 4A and 4B are top and cross-sectional views of a square well superlattice heterostructure type multiple 1-D p-channel device with strip gate.
Figure 4B:
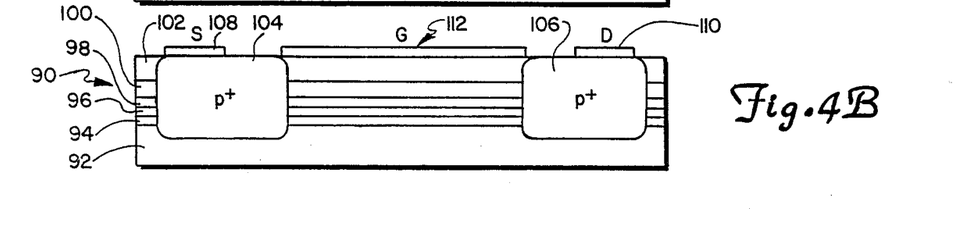

FIGS. 4A and 4B show FET 90, which has a superlattice configuration. It is generally similar to FET 60 shown in FIGS. 3A and 3B, except that there are multiple square wells, and thus several planes of 1-D p+ semiconductor wires can be achieved by application of gate bias voltages.

FET 90 includes a semi-insulating substrate 92 with alternating semiconductor layers: wide gap layer 94, narrow gap layer 96, wide gap layer 98, narrow gap layer 100, and wide gap layer 102. Narrow gap layer 100 (which is sandwiched between wide gap layers 98 and 102) forms an upper quantum square well, while narrow gap layer 96 (which is sandwiched between layers 94 and 98) forms a lower quantum square well. FET 90 also includes p+ source 104, p+ drain 106, source contact 108, drain contact 110, and strip gate 112. By applying bias voltage to strip gate 112, it is possible to produce two planes of 1-D p-type semiconducting wires which extend between source 104 and drain 106. The upper layer is confined within layer 100, and the lower plane of semiconductor wires is confined within layer 96. Confinement in the transverse direction is provided by the electric field produced by strip gate 112.

One significant advantage of the FETs of FIGS. 1A, 1B, 2A, 2B, 3A, 3B and 4A, 4B is that they can be combined with conventional n-channel FETs to produce complementary p and n channel devices. The use of strip gates for quantum confinement to produce 1-D dimensional p-channel devices allows the p-channel devices to have speeds comparable to their corresponding n-channel devices. The current flowing through the p-channel devices can be made equal to that through the n-channel devices by adjusting the width and length of each gate.

FIGS. 5 through 8 show the incorporation of FETs 10, 40, 60 and 90 into complementary structures. In FIGS. 5-8, similar reference numerals have been used as were used in the corresponding FIGS. 1A-4B, respectively.

Figure 5:
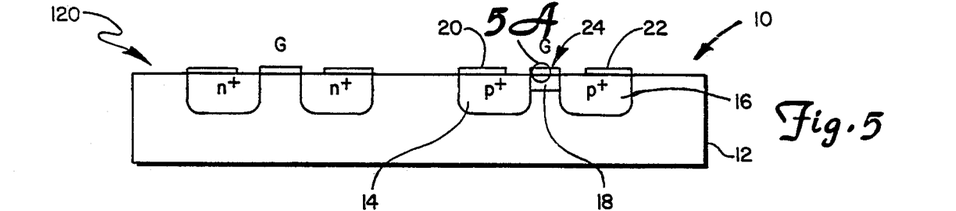
FIGS. 5 through 8 and 5A through 8A are cross-sectional and top views of complementary 1-D p-channel and 2-D n-channel devices.
Figure 5A:
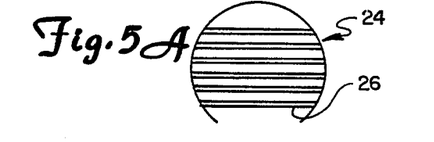
Figure 6:
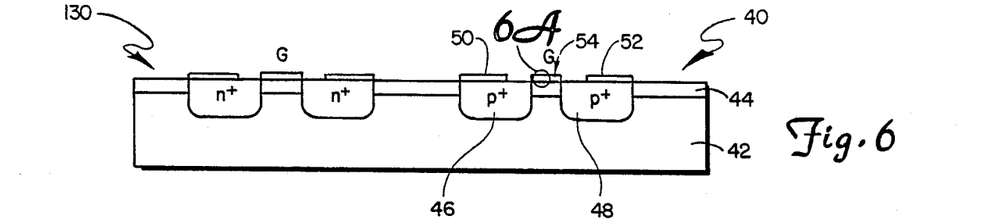
Figure 6A:
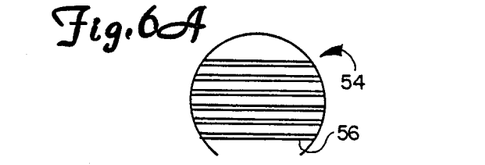
Figure 7:
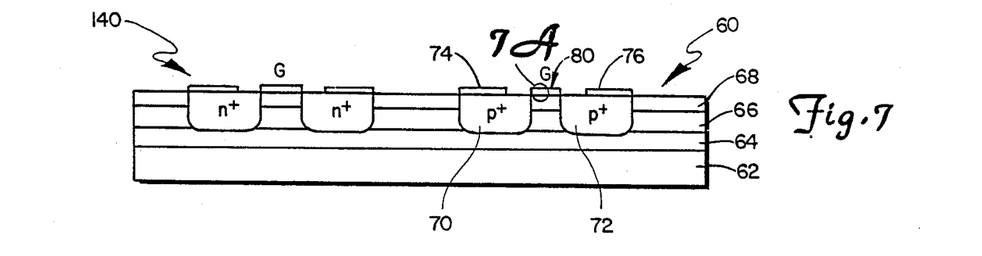
Figure 7A:
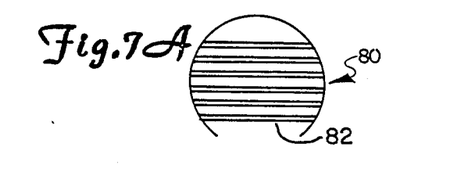
Figure 8:
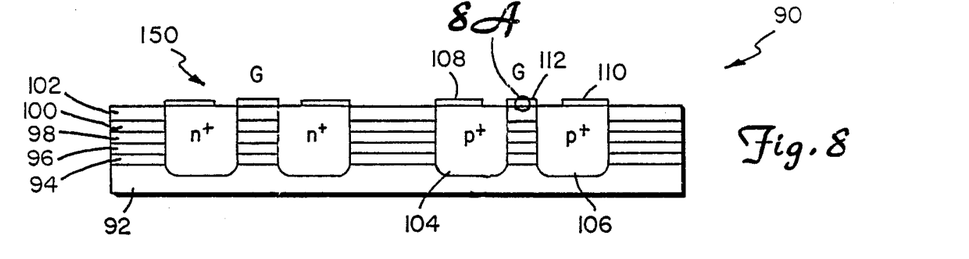
Figure 8A:
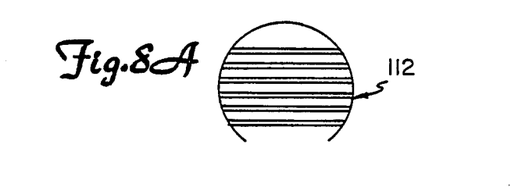

FIG. 5 shows a complementary MESFET device which includes p-channel 1-D FET 10 and n-channel 2-D MESFET 120. FIG. 6 shows a complementary HIGFET which includes n-channel HIGFET 130 as well as p-channel 1-D HIGFET 40. FIG. 7 shows a complementary square well HIGFET device which includes n-channel 2-D HIGFET 140 and p-channel 1-D HIGFET 60. FIG. 8 shows a superlattice well HIGFET device which includes superlattice n-channel 2-D HIGFET 150 together with superlattice p-channel 1-D HIGFET 90.

2. 1-D p-Type Optoelectronic Devices

In the last few years, there has been a growing interest in developing 1-D lasers and light-emitting diodes. This has been motivated by the possibility of a reduction in temperature dependence and threshold current associated with the peaked structure of the density of states in quasi 1-D semiconductor wires. In the past, the focus of studies, however, has been with n-type 1-D semiconductor wires for light-emitting devices.

FIGS. 9A-13D show five embodiments of radiation emitting devices which make use of 1-D p-type wires. These devices take advantage of the low density of state associated with the low values of hole effective mass and the low dimensionality in 1-D p-type structures, so that the threshold current needed to push the Fermi level up enough to create inverted populations of holes is significantly reduced. These devices can be made to operate at various wavelengths including visible light by using the subbands moved away from the band edges of the bulk material.

Figure 9A:
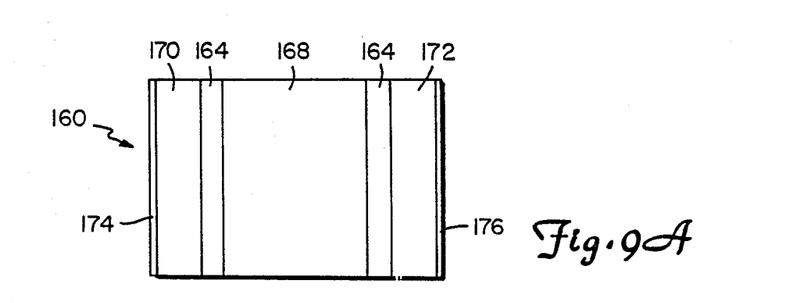
FIGS. 9A and 9B are top and cross-sectional views of a multiple 1-D p-wire homostructure laser.
Figure 9B:
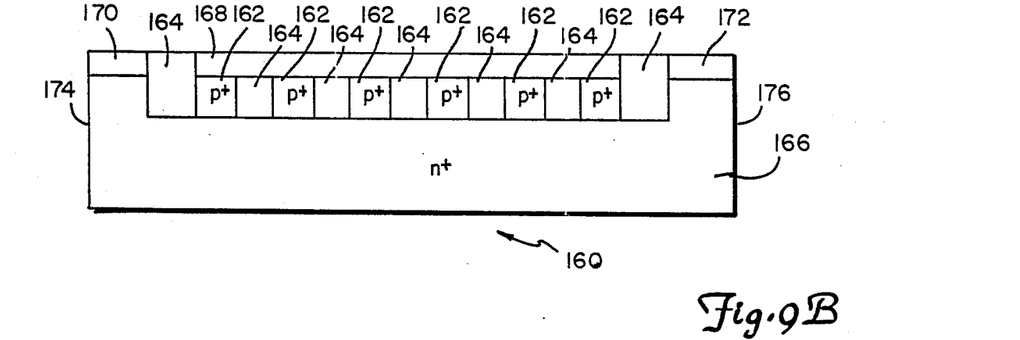

FIGS. 9A and 9B shows a homostructure multiple 1-D strip laser 160 which comprises multiple highly doped p-type semiconductor wires 162 separated by insulating walls 164 on top of a highly doped n+ layer 166. Insulating walls 164 are preferably made by ion bombardment or by etching and then filling with an insulator, or simply by etching and cutting techniques. P+ wires 162 are connected to a single metal contact 168 on their top side. N+ layer 166 is contacted at both ends to metal contacts 170 and 172. At opposite ends of n+ layer 166, there are mirror surfaces 174 and 176, which are formed by cleaved and polished surfaces or by reflective metal layers. The mirror surfaces 174 and 176 provide a resonant cavity for laser 160.

The small hole effective mass, and hence low density of states in p+ wires 162 resulting from quantum confinement and one-dimensionality makes the shifting of the Fermi level easy and, consequently, the threshold current of laser 160 small.

Figure 10A:
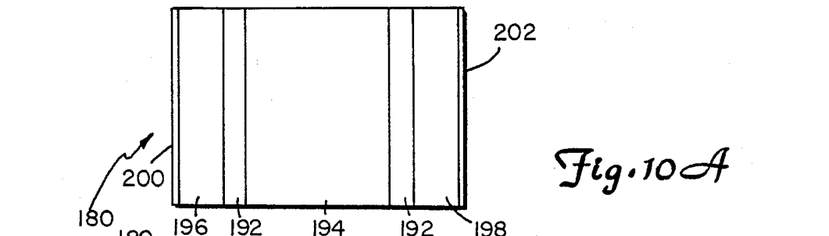
FIGS. 10A and 10B are top and cross-sectional views of a multiple 1-D p-wire heterostructure laser.
Figure 10B:
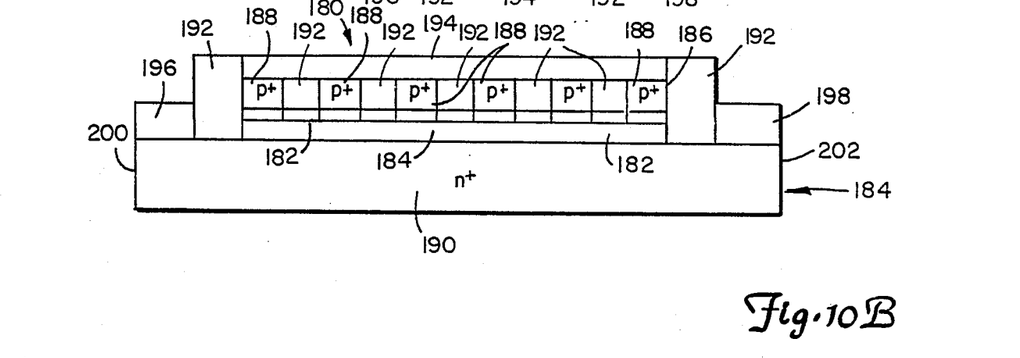

FIGS. 10A and 10B show a heterostructure multiple 1-D strip laser 180. Laser 180 includes a layer of narrow gap material 182 which is sandwiched in-between wide gap layers 184 and 186. Narrow gap layer 182 serves as the active region around the p n junctions joined by p+ wires 188 and n+ region 190. Insulating walls 192 separate p+ wires 188. Electrical contact to p+ wires 188 is made by a single metal contact 194. Contacts 196 and 198 make contact to opposite ends of n+ region 190. Contacts 196 and 198 are recessed, as shown in FIG. 10B. Mirror surfaces 200 and 202 at opposite ends of n+ region 190 form a resonant cavity for laser 180. In this embodiment, p+ wires 188 and insulating walls 192 merge down into the narrow gap layer 182 in which radiative recombination occurs.

Figure 11A:
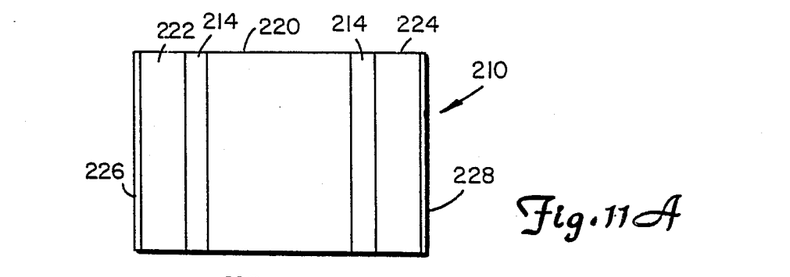
FIGS. 11A and 11B are top and cross-sectional views of a multiple 1-D n-p-wire homostructure laser.
Figure 11B:
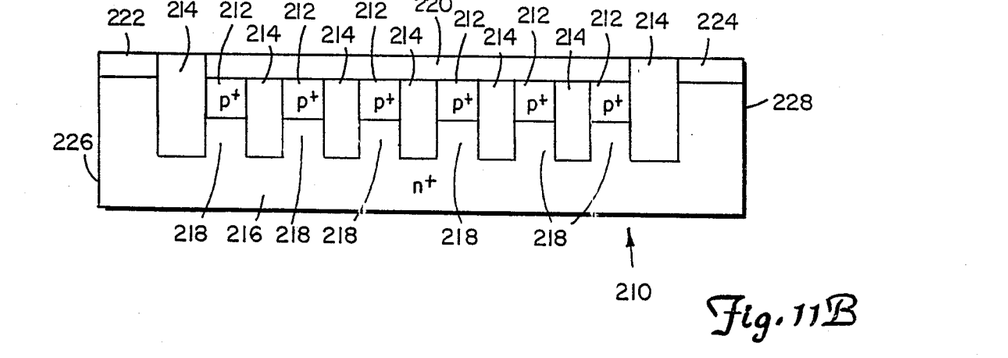

FIGS. 11A and 11B shows a modified homostructure 1-D strip laser 210. Laser 210 comprises a plurality of parallel p+ wires 212 which are separated by insulating walls 214. Unlike the embodiment shown in FIGS. 9A and 9B, insulating walls 214 of laser 210 extend deep down into n+ region 216 to form a corresponding n+ semiconductor wire 218 below each p+ semiconductor wire 212. Metal layer 220 contacts p+ wires 212, while electrical contact to n+ wires 218 is made by contacts 222 and 224 which contact opposite ends of n+ region 216. Mirrored surfaces 226 and 228 define a resonant cavity for laser 210. With the configuration shown in FIGS. 11A and 11B, laser 210 takes advantage of a reduced density of states in both the p+ wires 212 and the n+ wires 218. This is in addition to the reduced hole effective mass which is achieved by the use of p+ wires 212. The reduced density of states of electrons in n+ wires 218 further reduces the threshold current needed to shift the Fermi level.

Figure 12A:
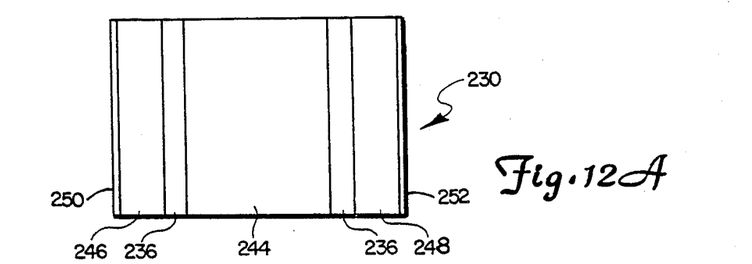
FIGS. 12A and 12B are top and cross-sectional views of a multiple 1-D n-p-wire heterostructure laser.
Figure 12B:
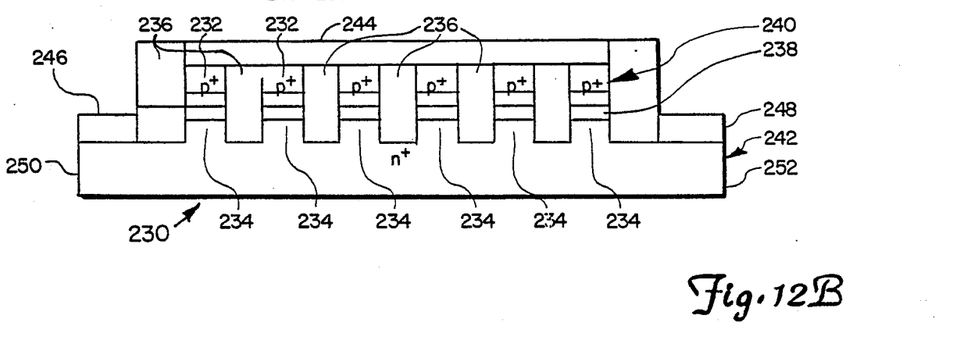

FIGS. 12A and 12B show a heterostructure multiple 1-D strip laser 230 which uses both p+ wires 232 and n+ wires 134. Deep insulation walls 236 provide the quantum confinement which forms each pair of p+ and n+ wires 232 and 234. In the embodiment shown in FIGS. 12A and 12B, laser 230 includes a thin layer of narrow gap material 238 which is sandwiched between wider gap layers 240 and 242. Narrow gap layer 238 is located and forms the active region of the p n junction formed by each p+ wire 232 and its corresponding n+ wire 234.

Metal layer 244 provides electrical contact to p+ wires 232. Contacts 246 and 248 contact n+ wide gap layer 242, and thus make electrical connection to n+ wires 234. Mirrored surfaces 250 and 252 define the resonant cavity of laser 230.

FIGS. 13A–13D show a modulation doped radiation emitting device which is a modification and improvement of the device described in a copending U.S. patent application Ser. No. 911,250 filed Sept. 25, 1986 by Michael Shur entitled "Modulation Doped Radiation Emitting Semiconductor Device". That application is assigned to the same assignee as the present application, and the description contained in that application is incorporated by reference into the present application.

As shown in FIGS. 13A–13D, radiation emitting device 260 is formed on an insulating or semi-insulating substrate 262 and includes a bottom gate 264, a bottom wide band gap semiconductor layer 266, a top wide band gap layer 268, and an intermediate narrower band gap active layer 270 which is sandwiched between top and bottom layers 268 and 266. Top gate 272, which is a strip gate similar to the strip gates described earlier with regard to FIGS. 1A, 1B–4A, 4B is positioned over top layer 268.

A pair of n+ regions 274 and 276 are positioned along opposite edges of active layer 270. A pair of p+ regions 278 and 280 are positioned along opposite edges of active layer 270.

Electrical contacts 282 and 284 make ohmic contact to n+ regions 274 and 276, respectively. Similarly, contacts 286 and 288 make ohmic contact to p+ regions 278 and 280.

Figure 13A:
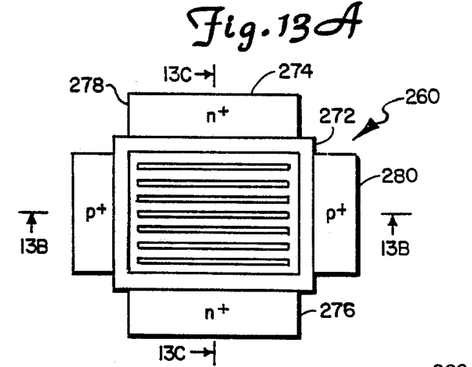
FIGS. 13A, 13B and 13C are top and cross-sectional views of a strip gate modulation doped radiation emitting device.
Figure 13B:
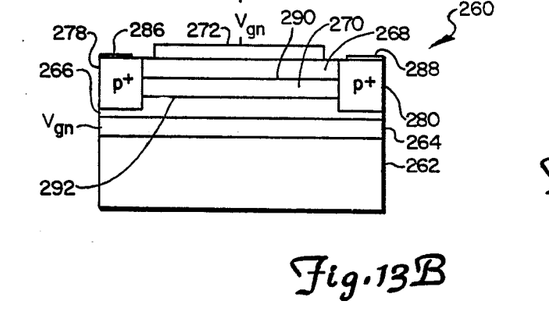
Figures 13C, 13D:
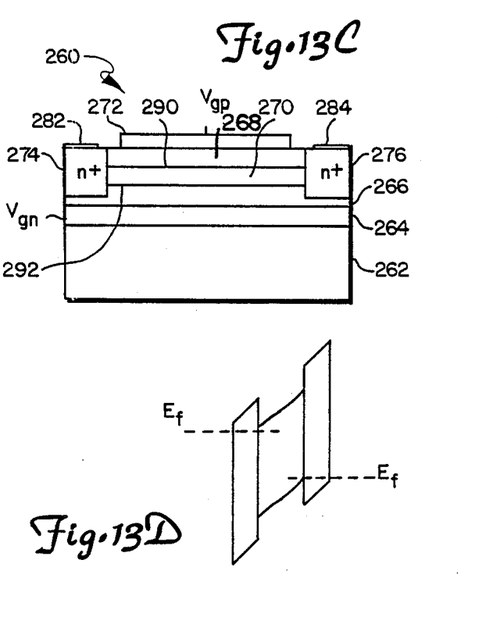
FIG. 13D is a diagram showing a band structure under the gate metal strip of the strip gate device of FIGS. 13A–13C.

Because of the difference in band gap between active layer 270 and the top and bottom layers 266 and 268, heterojunctions 290 and 292 are formed. In the embodiment shown in FIGS. 13A–13D, gate 262 has a voltage $V_{GN}$ applied to it which controls the creation of a 2-D electron gas at heterojunction 292. Gate 272 has a voltage $V_{GP}$ applied which induces multiple 1-D hole gas wires at heterojunction 290. The strips of gate 272, as shown in FIGS. 13A, are parallel to the longitudinal direction between p+ regions 278 and 280. By inducing 1-D hole gas wires, the effects of hole mass lightening in 1-D quantum wires is achieved.

In addition to the advantages which are described in the copending patent application by Michael Shur, device 260 has the further advantage that the Fermi level can be shifted up and down by small current in comparison to that required with a 2-D gate. Since the hole effective mass is much heavier than the electron effective mass in conventional 2-D quantum wells, it is more important to reduce the hole mass than it is to reduce the electron mass. For that reason, top strip gate 272 is used to create the hole gas (p+) wires. Further advantage can be achieved if the electron gas is in the form of 1-D electron gas wires rather than a 2-D electron gas, and this can be achieved by making bottom gate region 264 in the form of a strip gate as well. This further improvement, of course, comes at the cost of more complicated fabrication.

3. 2-D Square Well p-Channel HIGFETs

We have also discovered that the sharpness of a quantum well has a significant effect on the lightening of the hole effective mass. In particular, we have found that the effective hole mass is lighter in a square well than in a triangular or parabolic well of approximately the same size. This is the case not only in 1-D systems, but also in 2-D systems.

In the prior art, HIGFETs which use 2-D electron or hole gases have been of the triangular well type and, therefore, have not taken advantage of the lightening of hole effective mass which can be achieved by stronger quantum confinement.

Figure 14A:
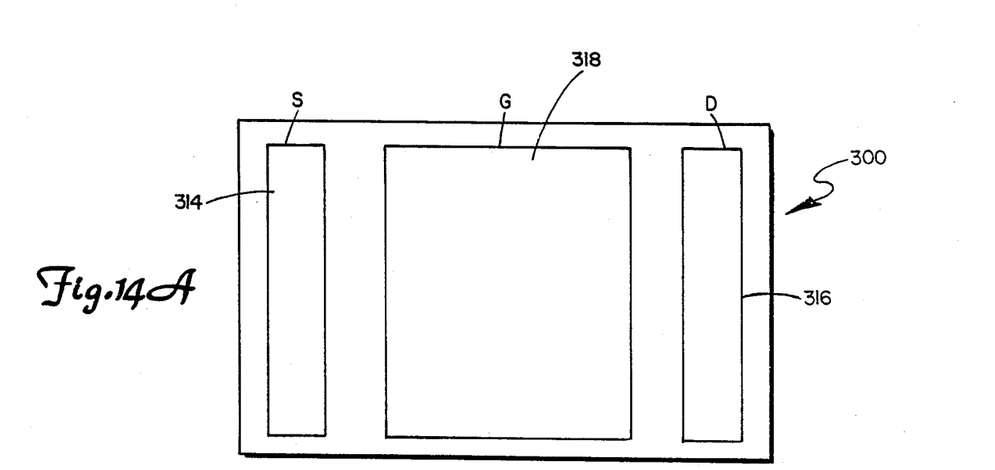
FIGS. 14A and 14B are top and cross-sectional views of a 2-D square well HIGFET.
Figure 14B:
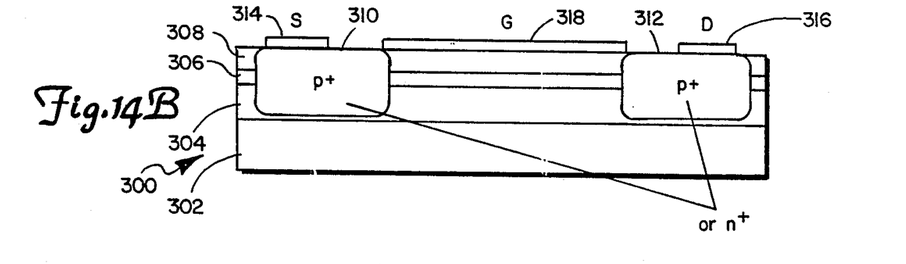

FIG. 14 shows a square well 2-D HIGFET having a substrate 302 of narrow band gap material covered by a layer 304 of wide gap material, a layer 306 of narrow band gap material, and a top layer 308 of wide band gap material. Layer 306 is sandwiched between layers 304 and 308 and, because of the band discontinuity between the wide and narrow band gaps, a square well for quantum confinement is formed. The thickness of layer 306 is between about 2 Angstroms and about 600 Angstroms.

HIGFET 300 includes source 310, drain 312, source contact 314, drain contact 316, and gate 318. Unlike the embodiment shown in FIGS. 3A and 3B, HIGFET 300 uses a conventional 2-D plane gate 318 rather than a 1-D strip gate. HIGFET 300 can be either a p-channel or an n-channel device, depending on whether source 310 and drain 312 are p+ or n+ conductivity.

Figure 15:
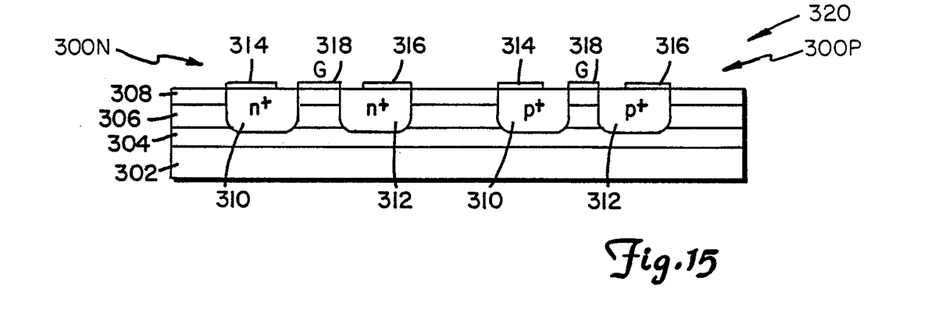
FIG. 15 is a cross-sectional view showing complementary square well HIGFETs.

FIG. 15 is a cross-sectional view of complementary semiconductor device 320, which includes square well n-channel HIGFET 300N and square well p-channel HIGFET 300P. FETs 300N and 300P are of the same construction shown in FIGS. 14A and 14B, and similar reference numerals have been used to designate similar elements.

Figure 16A:
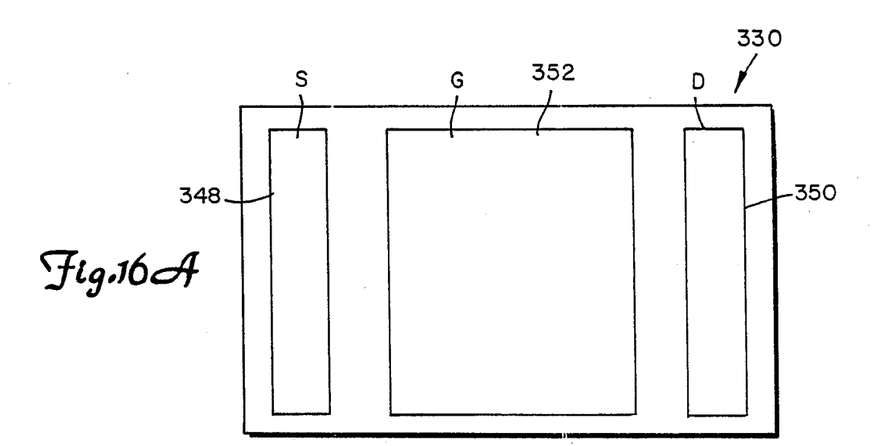
FIGS. 16A and 16B are top and cross-sectional views of a 2-D square well superlattice p-channel HIGFET.
Figure 16B:
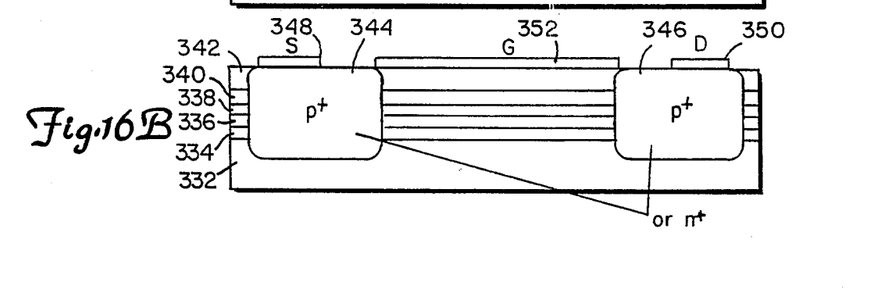

FIGS. 16A and 16B show a superlattice 2-D HIGFET 330 which makes use of square well quantum confinement to take advantage of reductions in the effective hole mass. HIGFET 330 has a narrow band gap substrate 332 with alternating layers 334, 336, 338, 340, and 342 of wide and narrow band gap material. Narrow band gap layers 336 and 340 form two layers of square quantum wells for confining a hole gas or an electron gas (depending on whether HIGFET 30 is a p-channel or an n-channel device).

HIGFET 330 includes source region 344, drain region 346, source contact 348, drain contact 350, and 2-D plane gate 352. By applying a bias voltage to gate- 352, the hole or electron gas induced in layers 340 and 336 can be controlled.

Figure 17:
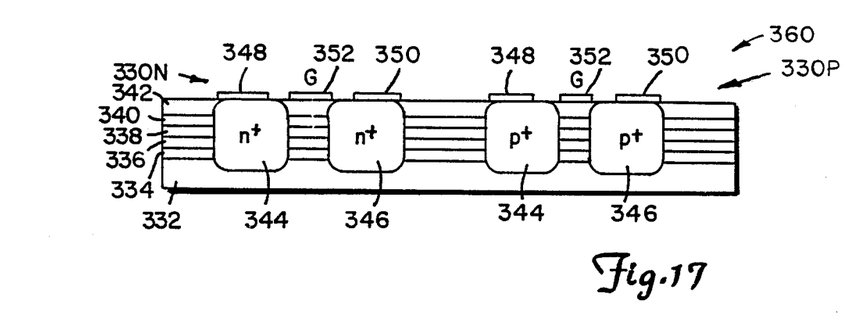
FIG. 17 is a cross-sectional view showing complementary square well superlattice HIGFETs.

FIG. 17 shows a complementary device 360 which uses complementary n-channel superlattice HIGFET 330N and p-channel superlattice HIGFET 330P. The construction of HIGFETs 330N and 330P are similar to the construction shown in FIGS. 16A and 16B, and similar reference numerals have been used.

4. Double Gate Multiple 1-D p-Channel Devices

Figure 18A:
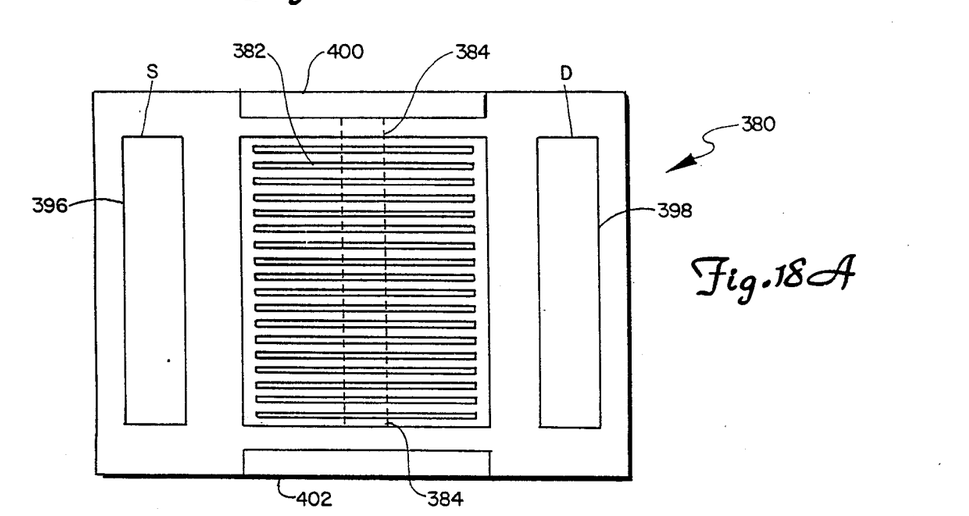
FIGS. 18A and 18B are top and cross-sectional views of a multiple 1-D p-channel device with a double gate structure.
Figure 18B:
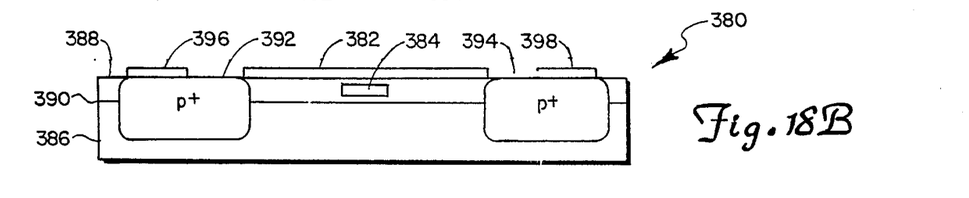

FIGS. 18A and 18B show FET 380, which is a heterostructure type multiple 1-D p-channel device with top strip gate 382 and short buried control gate 384. Except for the inclusion of control gate 384, the structure of FET 380 is generally similar to the one shown in FIGS. 2A and 2B. Narrow band gap substrate 386 and wide band gap layer 388 form a heterojunction 390 at their interface. FET 380 has a p+ source 392 and a p+ drain 394 which are contacted by source contact 396 and drain contact 398, respectively.

By applying voltage to top gate 382, 1-D p-type wires can be induced below heterojunction 390 which extend from source 392 to drain 394. Control gate 384 extends transversely between gate contacts 400 and 402, but is relatively short in the longitudinal (source-to-drain) direction. Strip gate 382 creates the conducting channels in the form of p-type 1-D wires, and short control gate 384 is used to turn the channels on and off. Since control gate 384 is short, the switching speed in transconductance of FET 380 is high.

Although in the embodiment shown in FIGS. 18A and 18B, control gate 384 is chosen as a buried gate, the positions of the strip gate 382 and control gate 384 can be reversed.

The embodiment shown in FIGS. 18A and 18B is representative of similar structures which can be formed with other 1-D p-channel devices, such as those shown in FIGS. 1A, 1B, 3A, 3B, and 4A, 4B. Similarly, a short control gate can be used in 2-D FETs like those shown in FIGS. 14A, 14B, and 16A, 16B.

5. Conclusion.

With the present invention, a variety of new p-channel, complementary and optoelectronic devices are possible where hole mobility enhancement and/or density of states reduction is achieved by tetrahedral symmetry breaking resulting from quantum confining holes to very narrow 2-D or 1-D channels. The enhanced hole mobility offers the advantage of high speed in transistors, particularly p-channel transistors. In the case of the optoelectronic devices, improved ability to invert carrier population (i.e. lower threshold currents for stimulated emission) is a significant advantage.

Although the present invention has been described with reference to preferred embodiments, workers skilled in the art will recognize that changes may be made in form and detail without departing from the spirit and scope of the invention.

What is claimed is:

1. A semiconductor device comprising:
   a body having a first surface;
   a first p-type region in the body;
   a second p-type region in the body spaced from the first p-type region;
   a hole confinement region in the body generally parallel to the first surface, having a first end connected to the first p-type region and a second end connected to the second p-type region, the hole confinement region confining movement of holes in a direction generally perpendicular to the first surface; and
   first gate means having a plurality of generally parallel conductive strips which are generally parallel to the first surface and extend in a direction from the first to the second p-type region for creating in the hole confinement region, as a function of an applied electric field, a plurality of generally parallel one-dimensional p-type conducting regions extending between the first and second p-type regions, wherein for each adjacent pair of the conductive strips, a one-dimensional p-type conducting region is induced.

2. The device of claim 1 wherein the hole confinement region is a p-type channel and is shallow and highly doped relative to the substrate.

3. The device of claim 1 wherein the hole confinement region is located adjacent a heterojunction formed by first and second semiconductor layers of different band gaps.

4. The device of claim 1 wherein the body includes a plurality of layers and the hole confinement region is a layer located between layers of semiconductor material, the hole confinement region having a band gap narrower than the band gap of the layers of semiconductor material.

5. The device of claim 1 and further comprising:
   second gate means located between the first and second p-type regions and extending in a direction generally transverse to the parallel conductive strips for controlling current flow through the one-dimensional p-type conducting regions.

6. The device of claim 5 wherein the second gate means has a length, in a direction from the first to the second p-type region, which is less than a length, in a direction from the first to the second p-type region, of the first gate means.

7. A p-channel FET comprising:
   a body having a generally planar first surface;
   a p-type source in the body;
   a p-type drain in the body and spaced from the source;
   a hole confinement region generally parallel to the first surface and extending between the source and drain for confining holes in a direction generally perpendicular to the first surface in a square quantum well;
   gate means for controlling flow of holes in the hole confinement region between the source and the drain; and
   a pair of conductive strips generally parallel to one another and to the first surface for inducing a 1-D p-type semiconductor wire in the hole confinement region as a function of an applied electric field, the 1-D wire having a first end connected to the source and a second end connected to the drain.

* * * * *